United States Patent [19]
Tarantola et al.

[11] Patent Number: 6,075,391
[45] Date of Patent: Jun. 13, 2000

[54] TURN-OFF CIRCUIT FOR AN LDMOS IN PRESENCE OF A REVERSE CURRENT

[75] Inventors: Mario Tarantola, Bareggio; Giuseppe Cantone, Siracusa; Angelo Genova, Delia; Roberto Gariboldi, Lacchiarella, all of Italy

[73] Assignee: STMicroelectronics S.r.l., Agrate Brianza, Italy

[21] Appl. No.: 09/095,735

[22] Filed: Jun. 11, 1998

[30] Foreign Application Priority Data

Jun. 24, 1997 [EP] European Pat. Off. ............. 97830298

[51] Int. Cl.[7] .............................................. H03K 17/687
[52] U.S. Cl. .......................... 327/111; 327/427; 327/589; 327/324
[58] Field of Search .................... 327/427, 325, 327/375, 378, 534, 537, 390, 589, 434, 324, 108, 111

[56] References Cited

U.S. PATENT DOCUMENTS 5,373,435  12/1994  Jayaraman et al. .................... 363/98
5,689,208  11/1997  Nadd ...................................... 327/390
5,883,547  3/1999  Diazzi et al. .......................... 327/589

FOREIGN PATENT DOCUMENTS 0 294 881 A2  6/1988  European Pat. Off. .
0 335 217 A2  3/1989  European Pat. Off. .
0 655 837 A2  11/1994  European Pat. Off. .
94/27370  11/1994  WIPO .

*Primary Examiner*—Tuan T. Lam
*Attorney, Agent, or Firm*—Theodore E. Galanthay; Allen, Dyer, Doppelt, Milbrath & Gilchrist, P.A.

[57] ABSTRACT

A circuit for charging a capacitance using an LDMOS integrated transistor functioning as a source follower and controlled, in a manner to emulate a high voltage charging diode of the capacitance. The LDMOS transistor is controlled via a bootstrap capacitor charged by a diode at the supply voltage of the circuit, and by an inverter driven by a logic control circuit as a function of a Low Gate Drive Signal and of a second logic signal which is active during a phase wherein the supply voltage is lower than the minimum switch-on voltage of the integrated circuit. The circuit uses a first zener diode to charge the bootstrap capacitor and the source of the transistor is connected to the supply node through a second zener diode.

19 Claims, 2 Drawing Sheets

TURN-OFF CIRCUIT FOR AN LDMOS IN PRESENCE OF A REVERSE CURRENT

FIELD OF THE INVENTION

The present invention relates to integrated circuits, and, in particular to driving circuits of power stages. Particularly, the invention refers to a bootstrap system or similar system wherein a capacitor is charged by means of an LDMOS integrated transistor emulating a high voltage diode.

BACKGROUND OF THE INVENTION

In integrated circuits that comprise output stages destined to drive discrete power devices or themselves integrated on the same chip containing the control circuitry, it is common to use a bootstrap capacitor to ensure correct powering of the driving stage. In these systems, it is essential that the bootstrap capacitance is charged in very short periods of time and this is usually attained through a diode emulator LDMOS transistor used to rapidly charge the bootstrap capacitance.

In the case of a driving circuit for a so-called High Side Driver (HSD) of a half-bridge output stage, the LDMOS transistor should be capable of charging the bootstrap capacitance when the HSD is referenced to low voltage (that is when its output is low). In addition, the LDMOS transistor should emulate a high impedance when the HSD is referenced to a high voltage (that is, when its output is high). These functioning conditions must be also ensured during the HSD switching phase from high to low voltage or vice versa. These conditions should also be ensured despite of the possible current injections resulting from the charging and discharging processes of the capacitances associated with the LDMOS integrated structure that must sustain the high voltage supply of the power device.

The publication WO 94/27370 discloses a half-bridge circuit comprising a driving module of the lower device and a driving floating module of the higher power device. The driving module of the higher transistor is realized in an isolated well region and a properly controlled LDMOS transistor emulates a high voltage charging diode for a bootstrap capacitor. In such a case it is necessary to control the effects of the parasitic bipolar junction transistors associated with the LDMOS integrated structure.

The European patent application EP-A-0743752, points out and describes certain conditions that cause problems related to the switch-on of parasitic transistors of the LDMOS integrated structure. The document also describes different circuit layouts capable of avoiding current consumption caused by the switch-on of parasitic transistors of the LDMOS integrated structure and avoiding the occurrence of conditions that may cause the destruction of the integrated device itself. FIG. 1 highlights the protecting circuit device described in the European patent application.

According to the approach described in the European patent application, there exists a functioning phase of the integrated circuit, referred to as UVLO, when the voltage supply Vs is less than the minimum switch-on voltage of the entire integrated device including also the LDMOS. During this phase, since SW1 and SW2 are both open, the potential of the VB body node of the LDMOS structure is kept at the circuit ground potential.

FIG. 1 shows that the LDMOS transistor is controlled through a bootstrap capacitor Cp charged by a diode D1 connected to the circuit supply node Vs by an inverter I01 driven by a Logic Control circuit as a function of a Low Gate Drive Signal and a second logic drive signal (UVLOb). The second logic drive signal is active during a phase in which the supply voltage Vs is lower than the minimum switch-on voltage of the integrated device.

Normally the LDMOS is commanded ON (node A brought to Vs by the inverter I01) only when the voltage on the LDMOS drain is lower than the source voltage. In contrast, if the LDMOS is accidentally switched on with VDS>0, an undesired inverse current is generated from the drain of the LDMOS integrated transistor toward the supply node Vs. This inverse current may damage the device or in any case discharge the bootstrap capacitor.

SUMMARY OF THE INVENTION

In view of the foregoing background, there is, therefore, a need for appropriate means for automatically switching off the LDMOS transistor in the event of an inverse current (from the drain toward the source). The present invention provides for an effective answer to this need.

According to the invention, along the current path through the LDMOS transistor is inserted a clamp element capable of automatically switching-off the LDMOS transistor in the event of an inverse current. In the presence of a direct current (from the source toward the drain) the clamp element has a substantially negligible resistance.

Essentially the circuit of the invention includes a zener diode, directly biased, connected between the supply node of the circuit and the source node of the LDMOS transistor. A second zener diode, in place of a normal charging diode, is used for charging the bootstrap capacitor of the relative charge pump circuit that drives the LDMOS transistor gate node and that comprises a control inverter. The respective zener breakdowns (VZ1 and VZ2) of the two zener diodes are sized so that if the LDMOS transistor is driven ON and VDS>0 the following condition is always satisfied:

$$VGS<V_{THRESHOLD} \text{ of the LDMOS}$$

BRIEF DESCRIPTION OF THE DRAWINGS

The different aspects and advantages of the present invention will become apparent upon perusal of the following detailed description when taken in conjunction with the annexed drawings wherein.

DETAILED DESCRIPTION OF THE PREFERRED EMBODIMENTS

Figure 1:
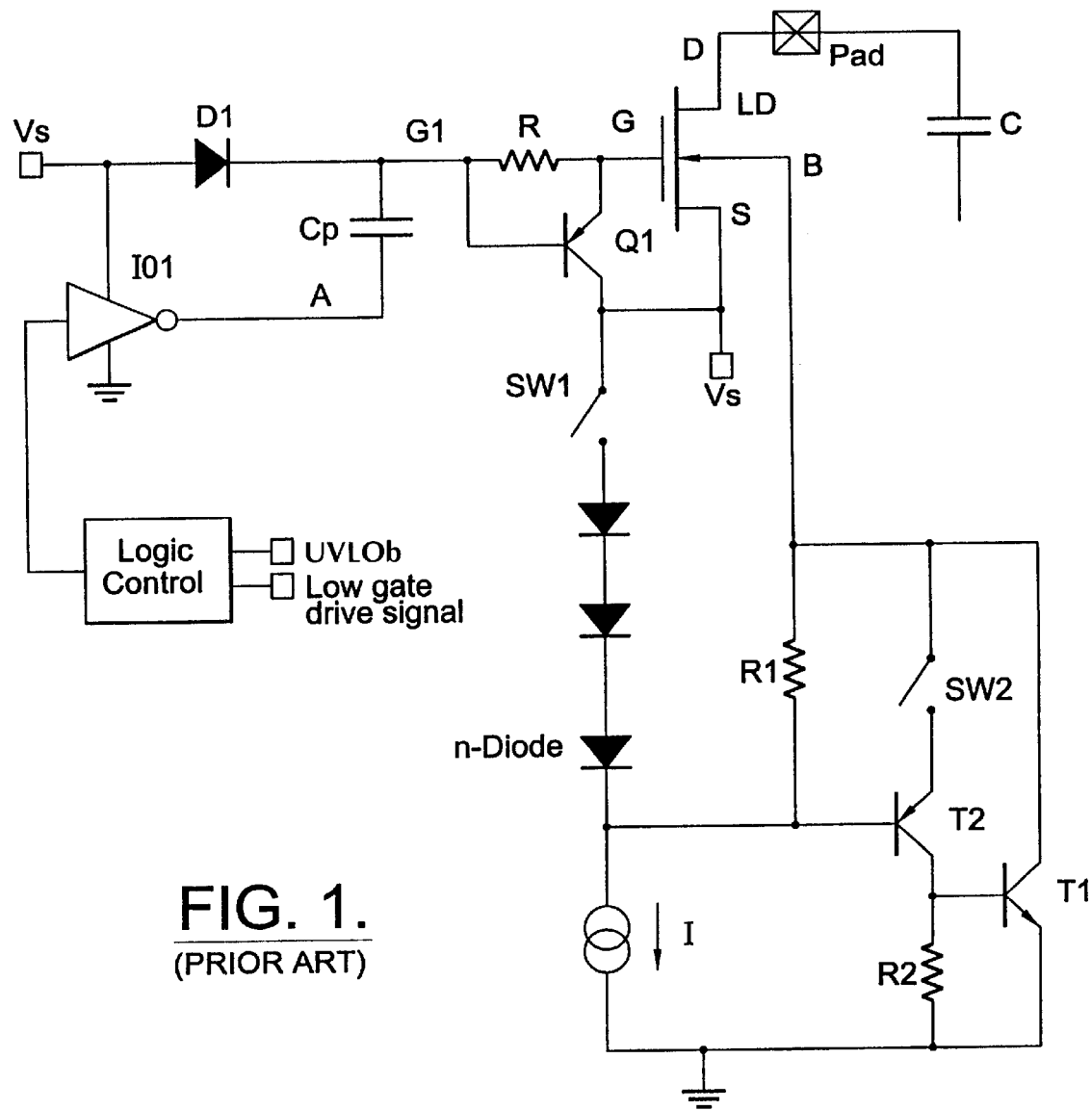
FIG. 1 represents, as aforementioned, a control scheme of an integrated LDMOS transistor that emulates a high voltage diode, according to the prior art.
Figure 2:
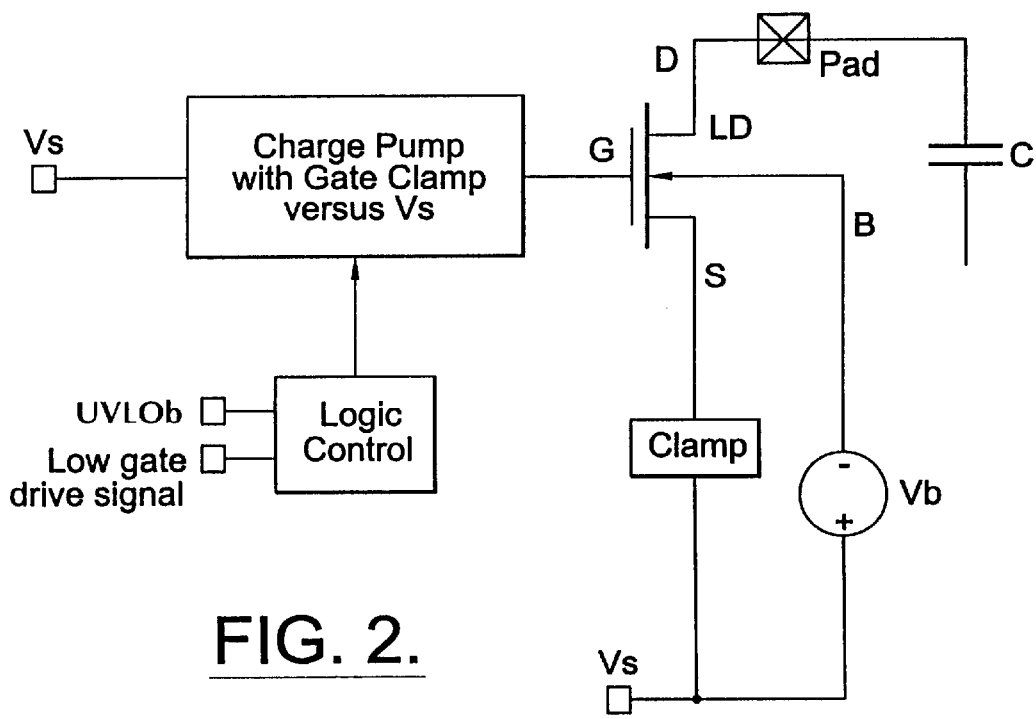
FIG. 2 is the circuit block diagram of the present invention.

The general scheme of the invention is illustrated in FIG. 2. The LDMOS LD transistor G gate is driven through a charge pump circuit controlled by the Logic Control block equipped with a clamp device toward Vs. Along the current path through the LDMOS transistor LDMOS LD a clamp device is inserted between the source node S and the supply node Vs.

Figure 3:
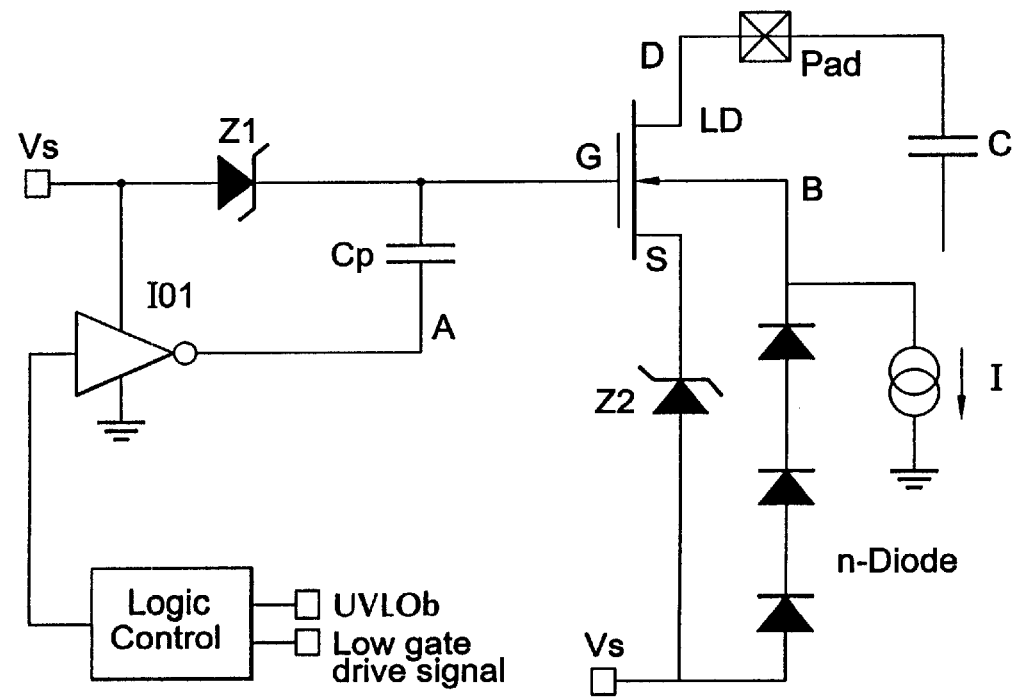
FIG. 3 is the circuit diagram of an embodiment of the invention.

A more detailed embodiment of the invention is illustrated in the circuit diagram of FIG. 3. The charge pump circuit that controls the gate of the LDMOS transistor LD, represented by the driving inverter IO1 and by the bootstrap capacitor Cp, rather than using a common charging diode of the Cp capacitance at the Vs supply voltage, uses, according to the invention, a first zener diode Z1.

A second zener diode Z2 is connected between the source node S of the transistor LD and the supply node Vs. In this configuration, when the controlling inverter I01 commands LD ON, that is, the voltage VA of the output node A of the inverter IO1 reaches the voltage supply, VA=Vs, the maximum voltage on the gate node VG is limited by the zener Z1, that is: VG≦Vs+VZ1.

If the voltage VD on the drain node of the transistor is greater than Vs−Vbe$_{Z1}$ (where Vbe$_{Z1}$ is the switch-on voltage referred to the zener junction Z1), the VS voltage increases with the drain voltage until 15 reaching the limit value Vs+VZ2. Hence if the LD transistor is still ON the current could start to flow in a reverse direction. Moreover, the value of the threshold voltage VTH of the LD transistor, will be strongly affected by the body effect because VSB=VZ2+nVbe, with Vbe being the threshold voltage of the n-diode junctions of the protection chain.

To define the correct value of the breakdown voltage of the two Z1 and Z2 zener diodes to ensure the switch-off of the LDMOS transistor LD when VD>Vs and the logic command imposes the switch-on of the transistor (node A at Vs), the followings two cases are considered:

a) when Vs>VZ1, VB=Vs−nvbe and VG=Vs+VZ1 to which corresponds:

$$VGS=(Vs+VZ1)-(Vs+VZ2)=VZ1-VZ2$$

and therefore if $$VTH>VGS=VZ1-VZ2 \quad (1)$$

the LD transistor remains OFF, even though the logic, across the buffer inverter IO1, commands it ON.

b) when Vs<VZ1, the body voltage is VB=Vs−nVbe, whereas the gate voltage is VG=2Vs−Vbe$_{z1}$, to which corresponds:

$$VGS=(2Vs-Vbe)-(Vs+VZ2)=Vs-Vbe-VZ2$$

and therefore if $$VTH>VGS=Vs-Vbe-VZ2 \quad (2)$$

the LD transistor remains OFF even though the logic, through the buffer IO1, commands it ON. In practice if VZ1=VZ2=10V and Vs=8V, the VGS is negative thus complying with the above indicated condition.

Both relationships (1) and (2) would be satisfied using a common diode in place of Z2 (that is, with a very high breakdown voltage). In this instance, however, some risks would arise because the source voltage (being the source node of high impedance) may reach an undesirably uncontrolled value, for example, by capacitive current injection during a fast VD transient. In this case the LD transistor could suffer damage because of the excessive value of either VGS or VSB.

That which is claimed is:

1. A circuit for charging a capacitance and comprising:
   an LDMOS integrated transistor functioning as a source follower and controlled to emulate a high voltage charging diode for the capacitance;
   an inverter;
   a logic control circuit for driving the inverter responsive to a low gate drive signal and a second logic signal, the second logic signal being active during a phase wherein a supply voltage is lower than a minimum switch-on voltage of the circuit;
   a first zener diode coupled to a gate of the LDMOS transistor;
   a bootstrap capacitor charged by the first zener diode at the supply voltage by the inverter;
   a second zener diode connecting a source of the LDMOS integrated transistor to the supply voltage;
   a plurality (n) of diodes connected together in series between the supply voltage and a body of the LDMOS integrated transistor defining n-diode junctions of a protection chain; and
   respective zener voltages of the first and second zener diodes satisfying the following conditions:

$$VTH>VZ1-VZ2 \text{ for } Vs>VZ1,$$

and $$VTH>Vs+Vbe-VZ2 \text{ for } Vs<VZ1$$

wherein VTH is the threshold voltage of the LDMOS integrated transistor, Vs is the supply voltage, VZ1 is the zener voltage of the first zener diode, VZ2 is the zener voltage of the second zener diode, Vbe is the threshold voltage of the n-diode junctions of the protection chain, and with a difference between a source voltage and a body voltage of the LDMOS integrated transistor equal to VZ2+nVbe.

2. A circuit according to claim 1, wherein VZ1 and VZ2 are identical to each other and greater than the supply voltage.

3. A circuit for charging a capacitance comprising:
   an LDMOS integrated transistor emulating a high voltage charging diode for the capacitance;
   a charge pump circuit connected to a gate of the LDMOS integrated transistor, said charge pump circuit comprising a bootstrap capacitor and a first zener diode connected thereto; and
   a second zener diode connected between a supply voltage and a source of the LDMOS integrated transistor;
   wherein said first and second zener diodes have respective zener breakdown voltages so that when the LDMOS integrated transistor is driven on and a voltage between a drain and the source is greater than zero, then a voltage between the gate and source is less than a threshold voltage of the LDMOS integrated transistor.

4. A circuit according to claim 3, further comprising an inverter connected to said bootstrap capacitor.

5. A circuit according to claim 4, further comprising a logic control circuit for driving the inverter responsive to a low gate drive signal and a second logic signal, the second logic signal being active during a phase wherein the supply voltage is lower than a minimum switch-on voltage of the circuit.

6. A circuit according to claim 3, further comprising a plurality (n) of diodes connected together in series between the supply voltage and a body of the LDMOS integrated transistor defining n-diode junctions of a protection chain.

7. A circuit according to claim 6, wherein the respective zener voltages of the first and second zener diodes satisfy the following conditions:

$$VTH>VZ1-VZ2 \text{ for } Vs>VZ1,$$

and $$VTH>Vs+Vbe-VZ2 \text{ for } Vs<VZ1$$

wherein VTH is the threshold voltage of the LDMOS integrated transistor, Vs is the supply voltage, VZ1 is the zener voltage of the first zener diode, VZ2 is the zener voltage of the second zener diode, Vbe is the threshold voltage of the n-diode junctions of the protection chain, and with a difference between a source voltage and a body voltage of the LDMOS integrated transistor equal to VZ2+ nVbe.

8. A circuit according to claim 7, wherein VZ1 and VZ2 are identical to each other and greater than the supply voltage.

9. A half-bridge driver circuit comprising:
   a first bootstrap capacitor;
   an LDMOS integrated transistor emulating a high voltage charging diode for the first bootstrap capacitor;
   a charge pump circuit connected to a gate of the LDMOS integrated transistor, said charge pump circuit comprising a second bootstrap capacitor and a first zener diode connected thereto; and
   a second zener diode connected between a supply voltage and a source of the LDMOS integrated transistor;
   wherein said first and second zener diodes have respective zener breakdown voltages so that when the LDMOS integrated transistor is driven on and a voltage between a drain and the source is greater than zero, then a voltage between the gate and source is less than a threshold voltage of the LDMOS integrated transistor.

10. A half-bridge circuit according to claim 9, further comprising an inverter connected to said second bootstrap capacitor.

11. A half-bridge circuit according to claim 10, further comprising a logic control circuit for driving the inverter responsive to a low gate drive signal and a second logic signal, the second logic signal being active during a phase wherein the supply voltage is lower than a minimum switch-on voltage of the driver circuit.

12. A half-bridge circuit according to claim 9, further comprising a plurality (n) of diodes connected together in series between the supply voltage and a body of the LDMOS integrated transistor defining n-diode junctions of a protection chain.

13. A half-bridge circuit according to claim 12, wherein the respective zener voltages of the first and second zener diodes satisfy the following conditions:

$$VTH > VZ1 - VZ2 \text{ for } Vs > VZ1,$$

and $$VTH > Vs + Vbe - VZ2 \text{ for } Vs < VZ1$$

wherein VTH is the threshold voltage of the LDMOS integrated transistor, Vs is the supply voltage, VZ1 is the zener voltage of the first zener diode, VZ2 is the zener voltage of the second zener diode, Vbe is the threshold voltage of the n-diode junctions of the protection chain, and with a difference between a source voltage and a body voltage of the LDMOS integrated transistor equal to VZ2+ nvbe.

14. A half-bridge circuit according to claim 13, wherein VZ1 and VZ2 are identical to each other and greater than the supply voltage.

15. A method for charging a capacitance with a driver circuit comprising the steps of:
   emulating a high voltage charging diode for a capacitance using an LDMOS integrated transistor;
   operating a charge pump circuit connected to a gate of the LDMOS integrated transistor, the charge pump circuit comprising a bootstrap capacitor and a first zener diode connected thereto;
   providing a second zener diode connected between a supply voltage and a source of the LDMOS integrated transistor; and
   choosing the first and second zener diodes to have respective zener breakdown voltages so that when the LDMOS integrated transistor is driven on and a voltage between a drain and the source is greater than zero, then a voltage between the gate and source is less than a threshold voltage of the LDMOS integrated transistor.

16. A method according to claim 15, further comprising the steps of:
   connecting an inverter to the bootstrap capacitor; and
   driving the inverter responsive to a low gate drive signal and a second logic signal, the second logic signal being active during a phase wherein the supply voltage is lower than a minimum circuit switch-on voltage of the driver circuit.

17. A method according to claim 15, further comprising the step of connecting a plurality (n) of diodes together in series between the supply voltage and a body of the LDMOS integrated transistor defining n-diode junctions of a protection chain; and wherein the step of choosing the respective zener voltages of the first and second zener diodes comprises choosing same to satisfy the following conditions:

$$VTH > VZ1 - VZ2 \text{ for } Vs > VZ1,$$

and $$VTH > Vs + Vbe - VZ2 \text{ for } Vs < VZ1$$

wherein VTH is the threshold voltage of the LDMOS integrated transistor, Vs is the supply voltage, VZ1 is the zener voltage of the first zener diode, VZ2 is the zener voltage of the second zener diode, Vbe is the threshold voltage of the n-diode junctions of the protection chain, and with a difference between a source voltage and a body voltage of the LDMOS integrated transistor equal to VZ2+ nVbe.

18. A method according to claim 17, wherein VZ1 and VZ2 are chosen to be identical to each other and greater than the supply voltage.

19. A method according to claim 15, wherein the capacitance being charged is an external bootstrap capacitor for a high side driver module of a half-bridge circuit.

* * * * *